United States Patent [19]

Mizuniwa et al.

[11] Patent Number: 5,007,979
[45] Date of Patent: Apr. 16, 1991

[54] METHOD OF FABRICATING GAAS SINGLE CRYSTAL

[75] Inventors: Seiji Mizuniwa; Akio Hattori; Tooru Kurihara, all of Hitachi; Seigi Aoyama, Kita-Ibaraki; Konichi Nakamura, Hitachi, all of Japan

[73] Assignee: Hitachi Cable Limited, Tokyo, Japan

[21] Appl. No.: 471,190

[22] Filed: Jan. 26, 1990

Related U.S. Application Data

[63] Continuation-in-part of Ser. No. 235,063, Aug. 22, 1988, abandoned.

[30] Foreign Application Priority Data

Sep. 7, 1987 [JP] Japan ................................ 62-221876

[51] Int. Cl.⁵ ............................................. C30B 11/06
[52] U.S. Cl. .................................. 156/605; 156/616.1; 156/616.2; 156/616.3; 156/616.4; 156/620.76; 156/DIG. 70; 252/62.36 A
[58] Field of Search ................. 156/605, 616.1, 616.2, 156/616.3, 616.4, 620.76, DIG. 70; 252/62.36 A

[56] References Cited

U.S. PATENT DOCUMENTS

| | | | |
|---|---|---|---|
| 3,520,810 | 7/1970 | Plaskett et al. | 252/62.36 A |
| 3,623,905 | 11/1971 | Akai et al. | 156/DIG. 70 |
| 3,630,906 | 12/1971 | Willardson, II et al. | 156/605 |
| 3,767,473 | 10/1973 | Ayel et al. | 252/62.36 A |
| 3,877,883 | 4/1975 | Berkman et al. | 156/616.2 |
| 4,035,154 | 7/1977 | Raab et al. | 156/616.2 |
| 4,488,930 | 12/1984 | Koe | 156/620.76 |

FOREIGN PATENT DOCUMENTS

| | | | |
|---|---|---|---|
| 2459591 | 7/1975 | Fed. Rep. of Germany | 156/616.2 |
| 48-30701 | 9/1973 | Japan | 156/605 |
| 50-15470 | 6/1975 | Japan | 156/616.2 |

OTHER PUBLICATIONS

Willardson et al., "Semiconductors and Semimetals, vol. 20, Semi-Insulating GaAs", Academic Press, Inc., New York, 1984, pp. 24–25.

Primary Examiner—Olik Chaudhuri
Assistant Examiner—Robert M. Kunemund
Attorney, Agent, or Firm—Dykema Gossett

[57] ABSTRACT

A method of fabricating an undoped or impurity-doped semi-insulating GaAs single crystal with the use of a silica boat comprises the steps of making a melt of GaAs in the silica boat except for a seed crystal, doping the melt with oxygen, maintaining the doped melt as it is for a predetermined period of time, solidifying the melt from the side opposite the seed crystal toward the seed crystal, seeding the melt when the melt attains a predetermined melt zone width on the seed crystal side, and moving the melt zone in the direction opposite the seed crystal for its solidification while keeping the melt zone width unchanged.

36 Claims, 3 Drawing Sheets

METHOD OF FABRICATING GAAS SINGLE CRYSTAL

RELATED APPLICATIONS

This application is a continuation-in-part of U.S. patent application Ser. No. 235,063, filed Aug. 22, 1988, now abandoned.

BACKGROUND OF THE INVENTION

1. Technical Field

The present invention relates to a method of fabricating a semi-insulating GaAs single crystal material with homogeneous impurity concentration such as chromium (Cr) and silicon (Si), produced by a horizontal zone melt method.

2. Background Art

A semi-insulating GaAs single crystal is typically fabricated by a boat method which utilizes a horizontal Bridgman method (HB method) and a gradient freeze method (GF method). These prior art methods, however, suffer from the drawback that they employ so-called "normal freezing" where the entire GaAs in a boat except for a seed crystal is melted, seeded, and then crystallized so that Cr with a small coefficient of segregation is extremely changed in its concentration in the longitudinal direction of the crystal (e.g., the concentration is changed from 10 to 100 times an ordinary value for its rate of solidification up to 0.9). In the case of Si, its concentration is changed to about five times.

A horizontal zone melt method is known to solve such a change of impurity concentration due to the segregation, as disclosed for example in Japanese Patent Application Second Publication No. 14382/1974. The zone melt method is generally adapted to provide a melt zone having a width less than the length of the boat or crystal, and the melt zone is moved while keeping the zone width unchanged from the rear end of the crystal in a direction of the seed crystal, seeds the crystal, and further moves the same from the seeded portion in the direction of the rear end for fabrication of a single crystal. The method makes it possible for impurities such as Cr which produce ordinary segregation to keep, assuming the melt width x and the crystal length 1, the impurity concentration from the seeded portion to a portion of 1−x unchanged.

However, residual Si, which enters the melt zone from the silica boat, is not accompanied by an ordinary segregation phenomenon. That is, the concentration of the residual Si is determined by the oxygen contained in a melt as shown by the following chemical reaction:

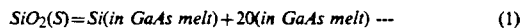

$$SiO_2(S) = Si(\text{in GaAs melt}) + 2O(\text{in GaAs melt}) \quad (1)$$

$$K = [Si[O]^2$$

In other words, the higher the oxygen concentration in the GaAs melt, the lower the Si concentration, while the lower the oxygen concentration, the higher the Si concentration. Thus, the HB method and GB method permit the oxygen to be more concentrated at the rear end of the crystal whereby the Si concentration is more reduced at the rear of the same although the segregation coefficient is about 0.14.

In order to keep the electrical characteristics of the Cr-doped semi-insulating crystal unchanged, it is necessary to keep unchanged not only the Cr concentration but also the residual Si concentration. In the aforementioned zone melt method, however, the melt width is narrow. This allows the single crystal portion to incorporate therein oxygen owing to the segregation as the single crystal is grown from the seed crystal portion, even if the oxygen has been dissolved in the melt. Additionally, no further supply of oxygen into the melt can be expected. Thus, the rear portion of the crystal has a reduced oxygen concentration but an increased Si concentration. That is, the conventional horizontal zone melt method suffers from producing a crystal with the residual Si concentration made non-homogeneous lengthwise, although the crystal has the homogeneous Cr concentration.

U.S. Pat. No. 3,623,905 teaches a method of producing a semi-insulating GaAs single crystal. In this prior art method, like the above-mentioned Japanese Patent Application Second Publication (14382/1979), oxygen is intentionally doped to reduce the remaining Si. Therefore, oxygen concentration is high in the melt zone at the rear end of the growth. This raises the problem of sticking. Specifically, the silica boat and the rear end of the crystal stick to each other since oxygen is excessively enriched thereat. If sticking occurs, the silica boat has to be broken to take out the crystal. The silica boat is very expensive, and generally it is expected to be used three to five times.

SUMMARY OF THE INVENTION

To solve the difficulties of the aforementioned conventional horizontal zone melt method, it is an object of the present invention to provide a method of fabricating a semi-insulating GaAs single crystal with additive impurities such as Cr as well as with residual Si which are adjusted to be homogeneous in their concentrations along the length thereof.

According to a first aspect of the present invention, there is provided a method comprising the steps of: preparing a melt from GaAs placed in a silica boat except for a seed crystal and doping the resulting melt with oxygen or an oxide; leaving the melt for a predetermined period of time as it is, in other words, letting the melt stand in the molten state for a predetermined period; solidifying gradually the melt thereafter from the side opposite the seed crystal toward the seed crystal; seeding said melt when said melt attains a predetermined melt zone width at the seed crystal side; and moving the melt zone to the side opposite the seed crystal for its solidification while keeping the zone width unchanged.

When effecting the zone melt growth according to the present invention, which differs from the prior method in that a melt zone is formed at the beginning in the latter method, the entire GaAs except for the seed crystal is kept in the melt state, oxygen or an added evaporated oxide is dissolved into the melt, and the melt is crystallized from the rear end thereof by normal freezing until the predetermined zone width is attained to thereby not only increase the oxygen concentration in the melt zone, but also to dissolve oxygen produced on the basis of segregation in the crystallized polycrystal, so that oxygen of a predetermined concentration is dissolved into the single crystal in the growth process, thus permitting the residual Si concentration to be also maintained constant.

According to a second aspect of the present invention, particularly to eliminate the drawback of sticking of the produced crystal with the silica ampule, there is provided a method using a silica boat which comprises the steps of: disposing a seed crystal, Ga or GaAs polycrystal (raw material) and C (dopant) in the silica boat; disposing the silica boat in a silica ampule near one end thereof and disposing As in the silica ampule near the other end thereof; heating the silica ampule entirely and evacuating the silica ampule; heating As in a manner such that the pressure inside the silica ampule attains approximately a dissociation pressure (1 atm) of GaAs and heating the silica boat homogeneously except the seed crystal, thereby producing vapors of Ga and As, which in turn react with each other, or melting the polycrystal GaAs such that a melt of GaAs is formed in the silica boat; leaving the silica boat to allow oxygen or oxide, which cannot be eliminated by the evacuation and inevitably remain in the silica ampule, to sufficiently melt in the melt of the GaAs made by the last step; cooling and solidifying the melt of GaAs into a polycrystal form from the side opposite the seed crystal at a speed not higher than 80 mm/hour until the melt of GaAs attains a predetermined melt zone width such that oxygen which has melted in the melt is enriched in the melt zone; seeding the melt when the predetermined melt zone width is attained at the side of the seed crystal; and moving the melt zone toward the side opposite the seed crystal with the melt zone width being maintained constant to allow a growth of GaAs single crystal.

In this method, oxygen is not intentionally doped in the melt during the crystal growth process. What is used is the only oxygen which naturally exists in the ampule, and such oxygen is effectively melted in the melt zone. Oxygen may exist on the inner wall of the ampule, in the silica boat and/or the surface of GaAs, which oxygen unavoidably remains in the ampule since the evacuation cannot remove oxygen completely. Due to a small amount of oxygen, it is possible to produce a semi-insulating GaAs single crystal which has a homogeneous residual Si concentration, and such a crystal does not stick to the ampule.

DESCRIPTION OF THE PREFERRED EMBODIMENT

Two preferred embodiments will be explained, one using FIGS. 1 to 5 and the other using FIGS. 1 to 3 and 6 and 7.

FIRST EMBODIMENT

Figure 1:
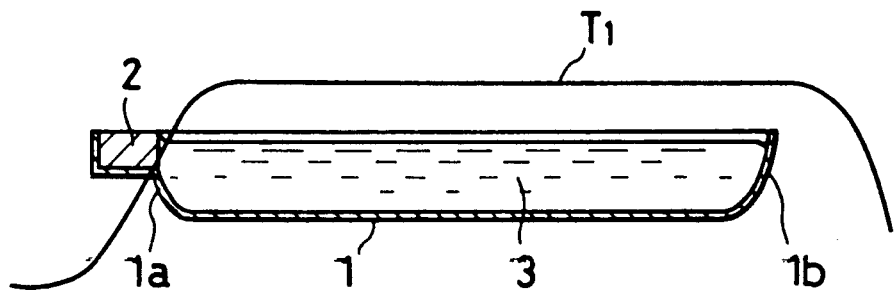
FIGS. 1 to 3 diagrammatically illustrate the method of fabricating a GaAs single crystal according to embodiments of the present invention.
Figure 2:
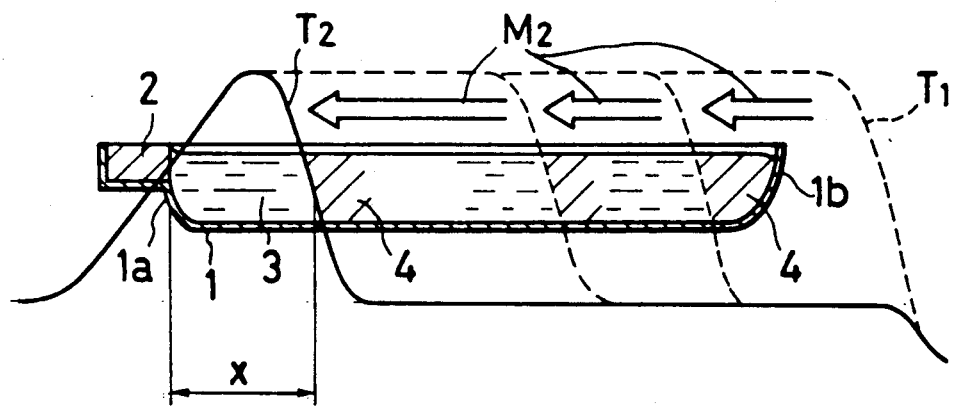
Figure 3:
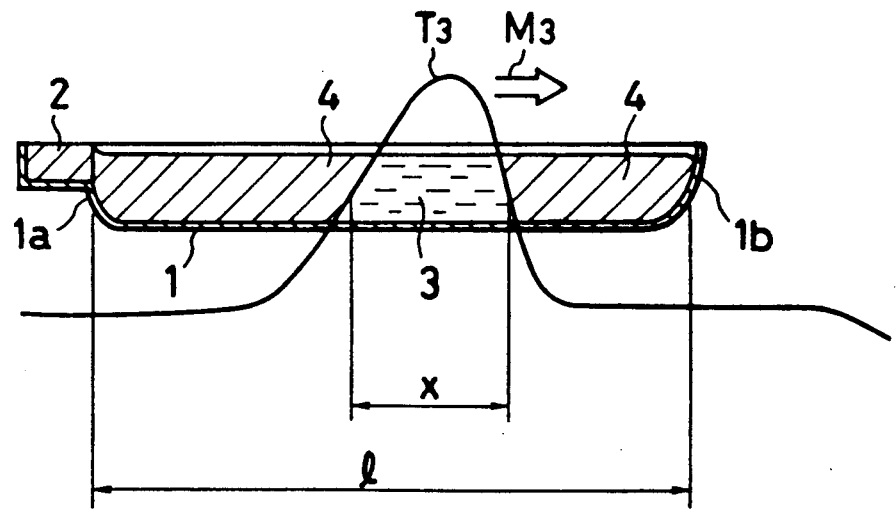

Referring to FIGS. 1 to 3, a process for fabricating a GaAs single crystal is shown utilizing a silica boat 1 and a seed crystal 2 along with the GaAs melt 3. GaAs single crystal 4 or a polycrystal is also illustrated.

The curves T1 to T2, respectively, indicate temperature distributions in an oven corresponding to positions of the silica boat 1, and the arrows M2 and M3 indicate moving directions of the temperature distributions in the oven.

In carrying out the method of the present invention, first GaAs is heated to produce melt 3 at a temperature above its melting point, preferably between 1240° and 1270° C., and most preferably to approximately 1250° C., as illustrated in FIG. 1, by the temperature distribution T1. The melt 3 in the boat 1 or the atmosphere near the melt 3 is doped with oxygen, which may be contained for instance in a gallium oxide. The melt 3 is left as it is for at least about thirty minutes and preferably for about five hours.

The temperature of the oven is gradually decreased, preferably to between about 1000° and 1200° C. in terms of the crystal temperature or 900° to 1230° C. in terms of melt temperature, from the rear end 1b toward the seed crystal 2 as indicated by arrow M2 in FIG. 2 from the temperature distribution T1 up to that time. The melt 3 is solidified to a polycrystal 4 from the rear end 1b to a portion near the seed crystal 2, around which portion the temperature distribution is given as designated by the curve T2. When the melt zone width of the melt 3 on the side of the seed crystal 2 reaches a predetermined value x, the melt 3 is seeded to crystal form from the seed crystal 2. The melt 3 is moved to the rear end b1 as indicated by arrow M3 in FIG. 3 with the melt zone width x of the illustrated temperature distribution T3 to form the single crystal 4 of length 1. The melt zone width x is selected to satisfy $x/1 = \frac{1}{2}$ to 1/20, preferably 1/10. Further, the moving rate of the melt zone is selected to range from about 4 to 15 mm/hour, and the melt temperature is preferably between 1240° and 1270° C.

By preparing the GaAs single crystal, the concentrations of Si and Cr as a dopant are made constant between the seed crystal 2 and a portion of the crystal where its ratio of solidification is given by $(1-x/1)$, and the concentration fluctuation of those impurities Si and Cr between the crystal 2 and the portion having solidification ratio $(1-x/1)$ is within ±50%.

The following examples are provided to more fully illustrate the scope of the present invention and are in no manner intended to limit its scope.

EXAMPLES

EXAMPLE 1

Figure 4:
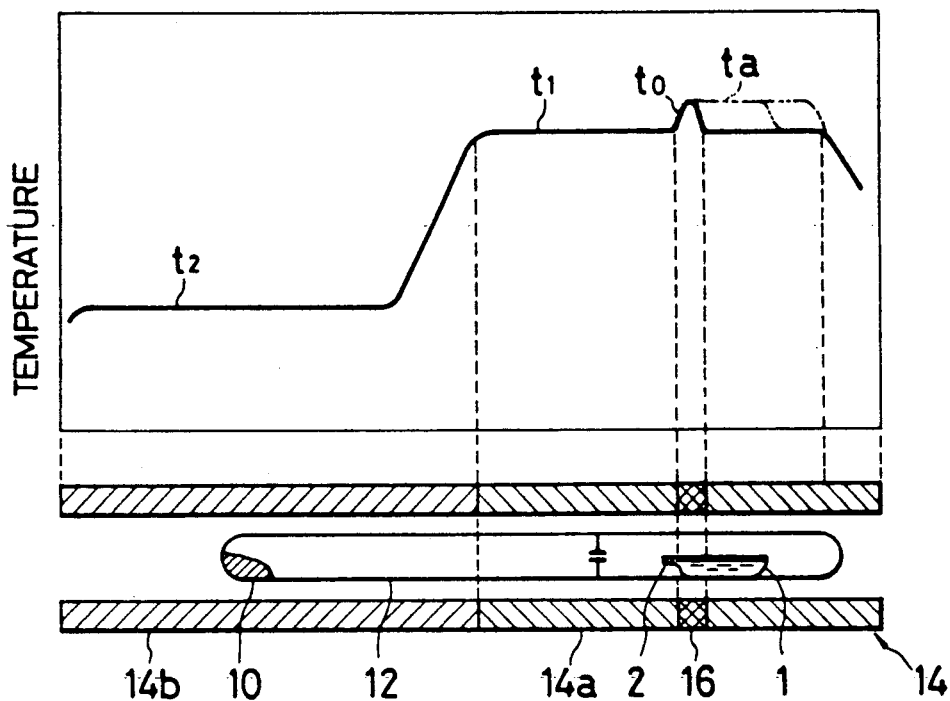
FIG. 4 illustrates the relationship between respective portions of a zone melt apparatus and temperature in the method of fabricating a GaAs single crystal according to a first embodiment of the present invention.

As illustrated in FIG. 4, a silica ampule is prepared by joining one glass tube containing a silica boat 1, which includes therein a seed crystal 2, 2500 g of Ga, 500 mg of a dopant Cr, and 50 mg of $Ga_2O_3$, to another glass tube containing 2790 g of As at its tip, evacuating the silica ampule at $5 \times 10^{-6}$ Torr or less for one hour and sealing the same. After setting the silica ampule 12 in a horizontal zone melt apparatus 14, the temperature to of a melt formation part 16 in a high-temperature oven 14a is adjusted to a temperature between 900° and 1270° C., preferably approximately to 1250° C., and the temperature $t_1$ of the other portion in the same is adjusted to 900°–1230° C. and preferably to 1200° C. Meanwhile, the pressure of As in the silica ampule 12 is kept constant. Although in this example $Ga_2O_3$ was employed as the oxide, $As_2O_3$ is also satisfactory.

The temperature $t_a$ of the entire boat 1 except the seed crystal 2 is raised to 1250° C. before starting crystal growth to thereby permit the entire boat 1 to be melted, and thereafter the entire boat 1 is left as it is for five hours. Further, the temperature of the oven is gradually decreased from the rear end side thereof for solidifying the crystal through normal freezing. However, the melt of 60 mm near the seed was left behind.

After the melt is seeded, either the melt apparatus 14 or the ampule 12 is moved oppositely at the rate of 5 mm/hour so as to permit a single crystal of 600 mm to be finally grown. Thereafter, the single crystal was cooled to room temperature at the rate of 100° C./hour and taken out.

The front and rear ends of the resulting crystal are sliced at the (100) plane thereof, polished, and etched with the use of KOH for examination of etch pitch density (EPD). An excellent crystal satisfying EPD≦5000 $cm^{-2}$ was produced.

Figure 5:
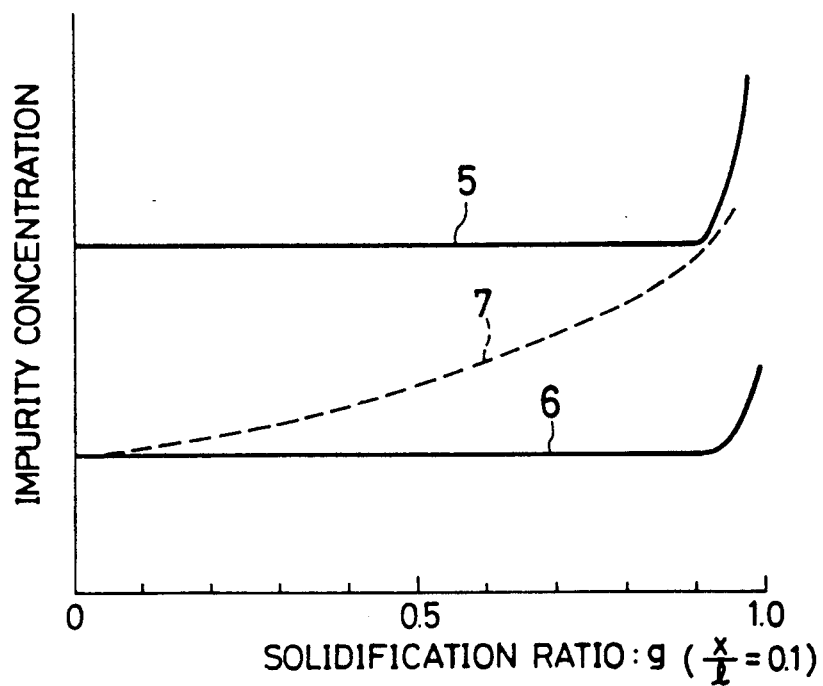
FIG. 5 is a view illustrating concentration distributions of Cr and Si along the length of single crystals produced by the methods of the first embodiment and by the prior art method.

The concentration of Cr, one of the impurities, as indicated by the curve 5 in FIG. 5, is constant and is relatively low up to 0.9 in terms of the solidification ratio, g, where $g = 1 - x/1$. Also, the concentration of Si, the other of the impurities, is constant and relatively low up to 0.9 in terms of g, as indicated by the curve 6 in FIG. 5. Therefore, the sum of the impurity concentrations (Cr and Si) up to g=0.9, or the sum between 0.0 and 0.9, is low, specifically less than 50% of the entire impurities (Cr and Si) existing between 0.0 and 1.0 in terms of g.

Comparison 1

The same ampule as in the above Example 1 was treated in a different way. After a melt zone width of 60 mm is made with respect to the crystal length 600 mm, a melt portion is moved at the rate of 500 mm/hour from the rear end to the seeding portion while keeping the melt zone width unchanged to seed the melt portion. Thereafter, the melt portion is moved oppositely at the rate of 5 mm/hour to permit a single crystal of 600 mm to be finally grown. The resulting single crystal is cooled at 100° C./hour to room temperature and taken out.

The properties of the resulting crystal were then examined, and there was found no difference between the present crystal and that of Example 1 with respect to the transition density and the Cr concentration. It was found, however, that the Si concentration was increased as illustrated by the distribution curve 7 as it goes to the rear end of the resulting crystal. This shows that there is a difference between the crystals of Example 1 and of this comparison in the specific electrical resistance of the crystal.

Comparison 2

A single crystal was prepared under the same conditions as in Example 1, but the time the melt was left intact after it was entirely melted was reduced to thirty minutes. It was thereupon found that the Si concentration at a portion of the single crystal grown to about 54 cm was about 1.5 times the seeded portion. It was also confirmed that a larger concentration difference appears as the time is reduced more.

EXAMPLE 2

An undoped semi-insulating crystal not doped with Cr was fabricated as described in Example 1. The same result in Example 1 was obtained in the Si concentration distribution.

SECOND EMBODIMENT

Figure 6:
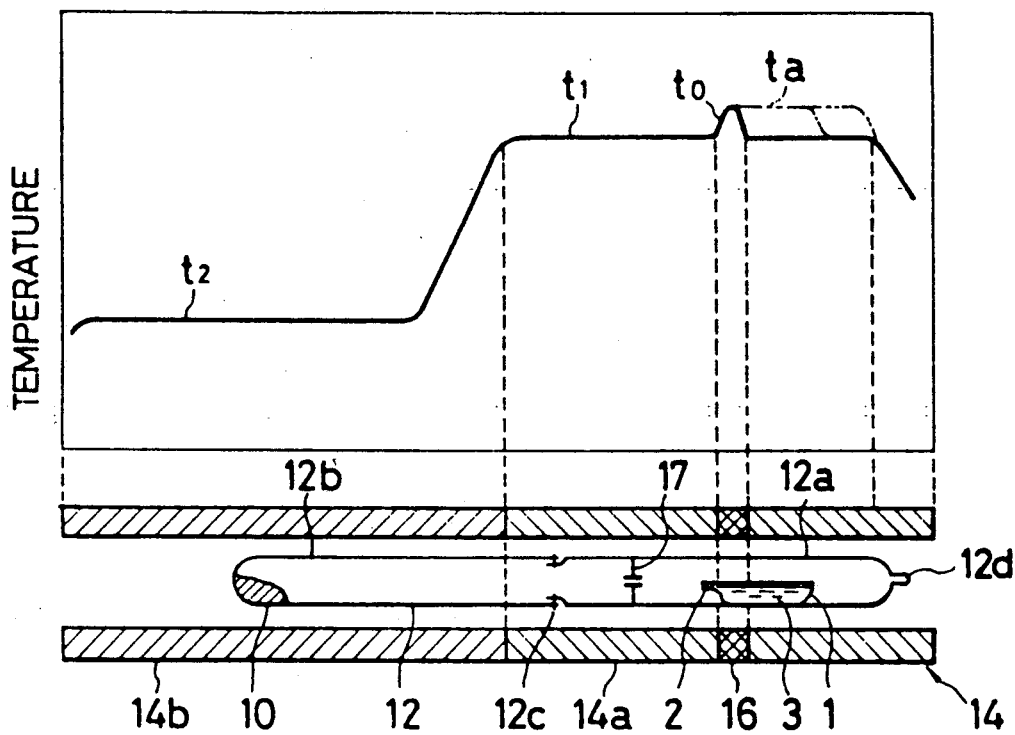
FIG. 6 illustrates the relation between the zone melt apparatus and temperature according to the second embodiment of the present invention.

In FIG. 6, numeral 12 designates the silica ampule which houses the silica boat 1 and As 10. As 10 is put in the ampule 12 to maintain the atmosphere pressure (gas pressure in the ampule) to about 1 atm. GaAs (seed crystal) 2 is located at one end of the silica boat 1. Numeral 14 designates the horizontal zone melt device, and it includes the high-temperature oven 14a the low-temperature oven 14b. Numeral 16 designates the melt-forming part.

First, the silica boat 1 which has the seed crystal 2 at one end thereof is placed in open ampule segment 12, and the dispersion plate 17 is attached to this ampule segment 12a. Then the ampule segment 12a is joined with the other ampule segment 12b, in which As 10 is placed beforehand by welding. Numeral 12c is a weldment.

The ampule segment 12a has a small opening 12d, and a vacuum pump (not shown) is connected to the opening 12d. Then, the entire ampule 12 is heated to a temperature of 150° to 200° C. for about one hour and then evacuated to $5 \times 10^{-6}$ Torr for at least one hour with the temperature (150° to 200° C.) being maintained. A temperature of 150° to 200° C. is chosen because moisture is not effectively removed below 150° C., and the loss of As, which functions to control the atmospheric pressure, increases beyond 250° C. At least one hour of evacuation is desirable because generally it requires at least approximately one hour to effectively remove moisture and oxides at a heating temperature of between 150° and 200° C. Somewhat less time for evacuation, for example, fifty minutes, may be satisfactory, depending upon other variables including the specific heating temperature. After the evacuation, the opening 12d is closed. At this point, most of the moisture and oxygen which had adhered on the inner wall of the ampule 12 and most of the $Ga_2O_3$ which had existed on the surface of the GaAs are removed from the interior of the ampule 12. However, it is important to note that the above-mentioned evacuation cannot completely remove the oxygen and oxide existing in the ampule.

Referring back to FIG. 1, GaAs is heated above its melting point (1245° to 1255° C., preferably 1250° C.) to form the melt 3 with a temperature distribution T1. Then, the melt 3 is left as it is at least for thirty minutes (preferably five hours) in order to allow oxygen, which inevitably remains in the ampule, to dissolve into the melt 3. Then, as shown in FIG. 2, the oven temperature is gradually dropped from curve T1 to curve T2 (1000° to 2000° C. in terms of crystal temperature) from the rear end 1b of the boat 1 to the seed crystal 2 as indicated by the arrow M2. Due to this temperature drop from T1 to T2, the melt 3 changes to the polycrystal 4. The melt 3 is solidified from the rear end of the boat 1 at a speed of solidification of 80 mm/hr. to ensure that oxygen will be enriched in the segregation. Beyond this speed, the segregation effect is reduced, and oxygen is not enriched in the melt. As a result of inadequate segregation and insufficient oxygen enrichment in the melt, the Si distribution would be homogeneous, the crystal would contain a large amount of Si, and the product would therefore not be a semi-insulating crystal. The polycrystal 4 extends near the seed crystal 2, but a certain amount of melt 3 having a melt zone width x is left at the side of the seed crystal 2. The remaining melt 3 is then seeded, and melt 3 is moved from the seed crystal 2 to the rear end 1b with the melt zone width x unchanged as indicated by the arrow M3 with a temperature distribution T3 as shown in FIG. 3, such that the single crystal 4 of a length 1 is formed. The melt zone width x is determined to satisfy the following ratio with the crystal length 1: $x/1 = \frac{1}{5}$ to 1/20, and more preferably 1/10. The melt 3 is moved at a speed of 4 to 15 ms/hour.

The product (GaAs single crystal) has homogeneous Si and Cr (dopant) concentrations between the seed crystal 2 and a portion having a solidification ratio $(1-x/1)$, and the concentration fluctuation of the impurities Si and Cr is within $\pm 50\%$ between the seed crystal 2 and the portion having a solidification ratio $(1-x/1)$.

Now the present embodiment will be discussed with comparable experiments using the prior art method. The following examples are, of course, not intended to limit the scope of the present invention.

EXAMPLES

EXAMPLE 3

As shown in FIG. 6, the silica boat 1 was put in the ampule segment 12a, and the dispersion wall 17 was disposed in the ampule segment 12a. The seed crystal 2, Ga (2,500 g) and Cr (500 mg) (dopant) had been placed in the silica boat 1 beforehand. As 10 (2,790 g) was put in the other ampule segment 12b, and two segments 12a and 12b were joined to each other at the respective free ends by welding. Numeral 12c is a weldment. Then, the entire ampule 12 was heated to 200° C. and held as it was for one hour. After that, the ampule 12 was evacuated to $5 \times 10^{-6}$ Torr or less by a vacuum pump (not shown) which was connected to the opening 12d of the ampule 12. The evacuation was continued one hour. Then the opening 12d was closed. The ampule 12 was set in the horizontal zone melt device 14, and heating started. The temperature to of the melt-forming part 16 was adjusted to 1,250° C., and the temperature $t_1$ of the other part was adjusted to 1,200° C. by the high temperature oven 14a. The low-temperature oven 14b, on the other hand, adjusted the temperature $t_2$ to about 600° C. in order to maintain As pressure to 1 atm. $Ga_2O_3$ was employed as the oxide, although $As_2O_3$ may be employed instead.

Before the crystal growth operation, the temperature $t_a$ of the silica boat 1 was raised to 1250° C., except for the seed crystal 2, so as to form the melt of GaAs 3. This situation was maintained for five hours. After that, the temperature of the oven was gradually lowered from the rear end side thereof (from the right in the illustration) such that the melt 3 is transformed to a polycrystal substance by normal freezing at a speed of 20 mm/hour. However, the melt 3 near the seed was left behind to have a width of 60 mm.

After seeding, the melting device 14 was moved toward the rear end (toward the right in the illustration), or the ampule 12 was moved toward the front end (toward the left in the illustration) at a speed of 5 mm/hour with the melt zone width being maintained to grow a single crystal having a length of 600 mm. Then the temperature was lowered to the room temperature at a speed of 100 degrees/hour. The resulting crystal did not stick with the boat.

The obtained single crystal was sliced at the (100) plane at the front and rear ends thereof and then polished and etched with KOH. It was found that the product was an excellent crystal with the etch pit density $(EPD) \leq 5,000$ cm$^{-2}$.

Figure 7:
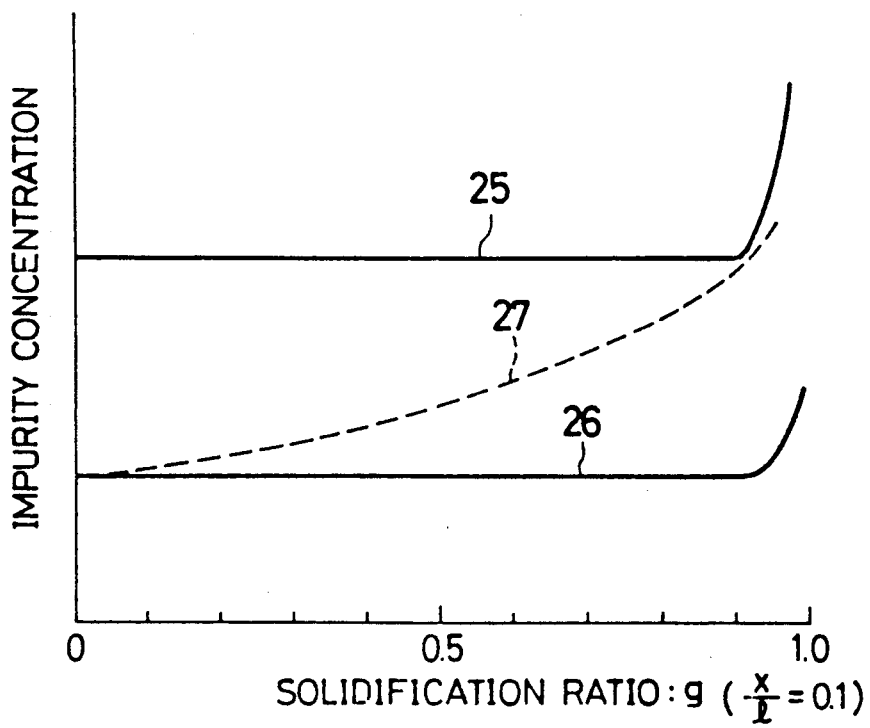
FIG. 7 is a view illustrating concentration distributions of Cr and Si in the longitudinal direction of the single crystals produced by the second embodiment and the prior art method.

FIG. 7 shows the examination results for Cr and Si concentrations in the longitudinal direction of the single crystal by GDMS, in which the curve 25 represents Cr concentrations, and the curve 26 represents Si concentration. The Cr concentration 25 is constant ($4.0 \times 10^{16}$ cm$^{-3}$) until about 54 cm ($g=1-x/1=0.9$), and the Si concentration 26 is also almost level ($0.6 \times 10^{16}$ cm$^{-3}$) until about 54 cm ($g=0.9$). The impurities (Cr +Si) between 0 and 0.9 in terms of g was less than 50% of the entire impurities (impurities between 0 and 1.0).

Comparison 3

The same ampule as that of Example 3 was prepared, but the entire melt was rapidly cooled and solidified except the 60 mm wide melt zone with respect to the 600 mm long crystal. Then the melt was seeded and moved to the other side at a speed of 5 mm/hour to grow a 600 mm long single crystal. After that, it was cooled to room temperature at a speed of 100 degrees/hour. The product was compared with the single crystal made in the last example, and it was found that there was little difference between them in EPD and Cr concentration, but there was considerable difference in Si concentration as indicated by the curve 27 in FIG. 7. Specifically, the Si concentration 27 was $2.0 \times 10^{16}$ cm$^{-3}$ at the front end ($g=0$) of the crystal, but it soon increases as it goes to the rear end. For example, the Si concentration 27 was $10 \times 10^{16}$ cm$^{-3}$ at $g=0.9$. This means that the crystal does not have homogeneous specific resistance in the longitudinal direction thereof.

Comparison 4

The single crystal was produced under the same conditions as Example 3, but the entire GaAs was maintained in a melt state for thirty minutes. Si concentration in the crystal at 54 cm ($g=0.9$) was $1.2 \times 10^{16}$ cm$^{-3}$, which is 1.5 times as much as Si concentration at the seeded portion $0.8 \times 10^{16}$ cm$^{-3}$. In a case where the melt of GaAs was maintained for less than thirty minutes, a larger difference appeared in Si concentration.

EXAMPLE 4

An undoped semi-insulating crystal or semi-insulating crystal without Cr doping was made under the same conditions as Example 3. Si concentration of the product possessed a similar curve as Example 3.

EXAMPLE 5

The single crystal was produced under the same conditions as Example 3, but the speed of moving the melt from the rear of the boat to obtain the polycrystal was set to 80 mm/hour. The product had an Si concentration of $0.8 \times 10^{16}$ cm$^{-3}$ at $g=0.1$ and $0.9 \times 10^{16}$ cm$^{-3}$ at $g=0.9$.

EXAMPLE 6

The single crystal was produced under the same conditions as Example 3, but the speed of moving the melt from the rear of the boat to obtain the polycrystal was set to 50 mm/hour. The product had a Si concentration of $0.6 \times 10^{16}$ cm$^{-3}$ at $g=0.1$ and $0.7 \times 10^{16}$ cm$^{-3}$ at $g=0.9$.

Comparison 5

GaAs single crystal was produced under the same conditions as Example 3, but the GaAs melt was moved from the rear of the boat for its solidification which was set to 100 mm/hour. Si concentration of the obtained crystal was $1.0 \times 10^{16}$ cm$^{-3}$ at the seeded portion which is 1.5 times as much as Example 3. The product was a semi-insulating crystal of poor quality, and it had unstable characteristics after annealing.

Comparison 6

GaAs single crystal was produced under the same conditions as Example 3, but GaAs melt was moved from the rear of the boat for its solidification which was set to 1500 mm/hour. Si concentration of the obtained crystal was $1.5 \times 10^{16}$ cm$^{-3}$ at the seeded portion, which is more than two times as much as Example 3. Si concentration at the rear end of the crystal ($g=0.9$) was $5.0 \times 10^{16}$ cm$^{-3}$ Accordingly, the resulting crystal was not the semi-insulating crystal.

Comparison 7

GaAs single crystal was produced under the same conditions as Example 3, but $Ga_2O_3$ of 50 mg was used. Si concentration of the product was approximately level ($0.1 \times 10^{16}$ cm$^{-3}$) between 0 and 0.9 in terms of g. However, the crystal stuck with the boat at the entire surface thereof.

Comparison 8

GaAs single crystal was produced under the same conditions as Example 3, but the heating temperature at the evacuation process was set to 120° C. Si concentration of the product was approximately level ($0.2 \times 10^{16}$ cm$^{-3}$) between 0 and 0.9 in terms of g. However, the crystal stuck with the boat at the entire surface thereof.

In summary, the second embodiment has the following advantages:

(1) Since oxygen or oxides are not intentionally or positively doped, i.e., oxygen which naturally exists is the only oxygen used to be enriched in the zone melt, Cr and residual Si concentration possess flat profiles, respectively, from the seeded portion to the rear end of the crystal. Also, the crystal does not stick to the boat.

(2) In addition, the obtained crystal possesses less fluctuation in characteristics such as resistance. This means that high resistance property is ensured in the wafer which is an important factor for the semi-insulating crystal.

What is claimed is:

1. A method of fabricating an undoped or impurity-doped semi-insulating GaAs single crystal with use of a silica boat, comprising the steps of:
   (A) preparing a melt of GaAs in the silica boat, said melt containing Si as an impurity;
   (B) maintaining a seed crystal in said boat at a seed crystal side;
   (c) in the presence of an oxygen source, letting said melt stand for a period of time sufficient to allow oxygen near said melt to dissolve in said melt;
   (D) solidifying said melt gradually from the side opposite said seed crystal toward said seed crystal side to form a polycrystalline material from a portion of said melt and to form a melt zone of unsolidified material, said gradual solidification being at a rate sufficient to cause oxygen dissolved in said melt to segregate in said melt zone;
   (E) seeding said melt zone when said melt zone reaches a melt zone width at said seed crystal side, said melt zone width not exceeding ½ the length of a GaAs single crystal formed from said melt;
   (F) moving said melt zone away from said seed crystal while keeping the melt zone width unchanged such that a GaAs single crystal grows from said seed crystal behind said moving melt zone, said GaAs single crystal having a substantially homogeneous Si concentration along its longitudinal axis; and
   (G) solidifying said melt zone.

2. The method of fabricating a GaAs single crystal as claimed in claim 1, wherein said impurities include chromium (Cr).

3. The method of fabricating a GaAs single crystal as claimed in claim 1, wherein said entire placed in said boat is maintained at a temperature of from about 1240° C. and transformed to a melt.

4. The method of fabricating a GaAs single crystal as claimed in claim 1, wherein said boat has an atmosphere containing oxygen.

5. The method of fabricating a GaAs single crystal as claimed in claim 4, wherein said oxygen is derived from an oxide selected from the group consisting of gallium oxide and arsenic oxide.

6. The method of fabricating a GaAs single crystal as claimed in claim 1, wherein said melt of GaAs is maintained in its melted state for about thirty minutes to about five hours.

7. The method of fabricating a GaAs single crystal as claimed in claim 1, wherein said unsolidified material is maintained at a temperature between about 900° and 1230° C. during said solidification step.

8. The method of fabricating a GaAs single crystal as claimed in claim 1, wherein said melt zone has a width x and said GaAs single crystal has a length 1 along said longitudinal axis, and wherein the ratio of the melt zone width x to the single crystal length 1 ranges from about ½ to 1/20.

9. The method of fabricating a GaAs single crystal as claimed in claim 8, wherein said melt zone width x is substantially given by the ratio of $x/1 = 1/10$ relative to the single crystal length 1, and the melt temperature in the melt zone is maintained between about 1240° and 1270° C./

10. The method of fabricating a GaAs single crystal as claimed in claim 9, wherein said melt zone is moved at a rate of from about 4 to about 15 mm per hour.

11. A method of fabricating a GaAs single crystal, comprising the steps of:
    (A) placing in one part of the silica ampule a silica boat containing Ga, Cr as a dopant, an oxide and a seed crystal while placing As in the other part of the silica ampule, joining said two parts to each other so as to form one silica ampule, and evacuating said silica ampule, wherein oxygen remains in said ampule after said evacuation;
    (B) setting said silica ampule in a horizontal zone melt apparatus composed of a high-temperature oven and a low-temperature oven so that said silica boat is positioned to one side of the high-temperature oven;
    (C) raising the temperature of the high-temperature oven in the horizontal zone melt apparatus so as to make a melt from the entire GaAs in the boat except for the seed crystal at one end of said boat while raising the temperature of the low-temperature oven so as to evaporate As, said melt containing Si as an impurity;

(D) leaving the high and low-temperature ovens as they are for a period of time sufficient to allow oxygen from said oxide and said oxygen still remaining in said silica ampule to dissolve in said melt;

(E) decreasing the temperature of the high-temperature oven so as to gradually solidify the melt from the side opposite the seed crystal toward the seed crystal side to form a polycrystalline material from a portion of said melt and to form a melt zone of unsolidified material, said gradual solidification being at a rate sufficient to cause oxygen dissolved in said melt to segregate in said melt zone;

(F) seeding said melt zone when said melt zone attains a melt zone width on the side of the seed crystal, said melt zone width not exceeding ½ the length of a GaAs single crystal formed from said melt; and (G) relatively moving the silica ampule and said horizontal zone melt apparatus in a manner such that said melt zone is moved away from said seed crystal for its solidification while keeping said melt zone width unchanged such that a GaAs single crystal grows from said seed crystal behind said moving melt zone, said GaAs single crystal having a substantially homogeneous Si concentration along its longitudinal axis.

12. The method of fabricating a GaAs single crystal as claimed in claim 11, wherein said oxide is selected from the group consisting of $Ga_2O_3$ and $As_2O_3$.

13. The method of fabricating a GaAs single crystal as claimed in claim 11, wherein the temperature of the high-temperature oven at a position corresponding to the boat is adjusted between abut 900° and 1270° C., so as to regulate the overall temperature of the high-temperature oven to a temperature between about 900° and 1230° C. during step (C) to make said melt from the entire GaAs in the boat except for the seed crystal, and said oven temperature is maintained for about thirty minutes to about five hours.

14. The method of fabricating a GaAs single crystal as claimed in claim 11, wherein the temperature of the high-temperature oven at the rear end of the boat is gradually decreased from the rear end of the boat toward the seed crystal to a temperature between about 900° and 1270° after said leaving step until the melt attains said melt zone width on the side of the seed crystal.

15. The method of fabricating a GaAs single crystal as claimed in claim 14, wherein said horizontal zone melt apparatus is moved during said relative moving step while maintaining the temperature of the melt zone at a temperature between about 1240° and 1270° C.

16. The method of fabricating a GaAs single crystal as claimed in claim 11, wherein said silica ampule is moved relative to said horizontal zone melt apparatus during said relative moving step.

17. The method of fabricating a GaAs single crystal as claimed in claim 11, wherein said horizontal zone melt apparatus is moved relative to said silica ampule during said relative moving step.

18. The method of fabricating a GaAs single crystal as claimed in claim 14, wherein said silica ampule is moved relative to said horizontal zone melt apparatus.

19. A method of fabricating Cr-doped semi-insulating GaAs single crystal using a silica boat, comprising the steps of:

(A) disposing a seed crystal, a raw material selected from the group consisting of Ga and GaAs, and Cr as a dopant in the silica boat;

(B) disposing the silica boat in a silica ampule near one end thereof and disposing As in the silica ampule near the other end thereof;

(C) heating the silica ampule entirely and evacuating the silica ampule, wherein there resides in said ampule after said evacuation a source of oxygen selected from the group consisting of oxygen and oxides;

(D) heating the As in a manner such that the pressure inside the silica ampule becomes approximately a dissociation pressure of GaAs of 1 atm and heating the silica boat homogeneously except for the seed crystal, such that a melt of GaAs is formed from said raw materials in the silica boat, said melt containing Si as an impurity;

(E) maintaining the melt of GaAs made in step (D) a sufficient period of time to allow at least a portion of said oxygen from said oxygen source in the silica ampule to dissolve in the melt of GaAs;

(F) cooling and solidifying the melt of GaAs into a polycrystal from the side opposite the seed crystal toward the seed crystal at a speed not higher than 80 mm/hour to form a melt zone, said cooling and solidifying step causing oxygen dissolved in said melt to segregate in said melt zone;

(G) seeding the melt zone when a melt zone width is attained at the side of the seed crystal in step (E), said melt zone width not exceeding ½ the length of a GaAs single crystal formed from said melt; and (H) moving the melt zone away from the seed crystal with the melt zone width being maintained constant to grow a GaAs single crystal having a substantially homogeneous Si concentration along its longitudinal axis.

20. The method of claim 19, wherein the step (C) heating temperature is between about 150 and 250° C., said evacuation is performed at least for about one hour and the ampule is evacuated at least to $5 \times 10^{-6}$ Torr.

21. An ingot fabricated by the method of claim 1.

22. A wafer fabricated by slicing the ingot of claim 21.

23. A method of fabricating an undoped or impurity-doped semi-insulating GaAs single crystal with use of a silica boat, comprising the steps of:

(A) preparing a melt of GaAs in a silica boat;

(B) maintaining a seed crystal in said boat at a seed crystal side;

(C) in the presence of an oxygen source, letting said melt stand for a period of time sufficient to allow oxygen near said melt to dissolve in said melt, said melt containing Si as an impurity;

(d) solidifying said melt gradually from the side opposite said crystal toward said seed crystal side to form a polycrystalline material from a portion of said melt and to form a melt zone of unsolidified material, the width of said melt zone not exceeding ½ the length of GaAs single crystal formed from said melt, said gradual solidification being at a rate sufficient to cause oxygen dissolved in said melt to segregate in said melt zone;

(E) seeding said melt zone with said seed crystal;

(F) moving said melt zone, the oxygen concentration of which is raised as a result of the step (D), in the direction opposite said seed crystal while keeping the width of said melt zone unchanged; and (G) solidifying said melt zone to obtain a GaAs single crystal of substantially homogeneous Si concentration along its longitudinal axis.

24. The method of fabricating a GaAs single crystal as claimed in claim 23, wherein said GaAs single crystal further includes chromium.

25. The method of fabricating a GaAs single crystal as claimed in claim 23, wherein said GaAs in said boat is maintained at a temperature of from about 1240° to 1270° C. to form said melt.

26. The method of fabricating a GaAs single crystal as claimed in claim 23, wherein said boat has an atmosphere containing oxygen and silicon.

27. The method of fabricating a GaAs single crystal as claimed in claim 23, wherein said melt of GaAs is maintained in its melted state for about thirty minutes to about five hours.

28. The method of fabricating a GaAs single crystal as claimed in claim 23, wherein said melt is maintained at a temperature between about 900° and 1230° C.

29. The method of fabricating a GaAs single crystal as claimed in claim 23, wherein said melt zone has a width x and said GaAs single crystal has a length 1, and a ratio of the melt zone width x to the single crystal length 1 ranges from about ½ to 1/20.

30. The method of fabricating a GaAs single crystal as claimed in claim 29, wherein said melt zone width x is substantially given by the ratio of x/1=1/10 relative to the single crystal length 1, and the melt temperature in the melt zone is maintained between about 1240° and 1270° C.

31. The method of fabricating a GaAs single crystal as claimed in claim 30, wherein said melt zone is solidified at a rate of from about 4 to about 15 mm per hour during said moving of the melt zone in the direction opposite the seed crystal.

32. A method of fabricating a GaAs single crystal, comprising the steps of:

(A) placing in one part of a silica ampule a silica boat containing Ga, Cr as a dopant, an oxide and a seed crystal while placing As in the other part of the silica ampule, joining said two parts to each other so as to form one silica ampule, and evacuating said silica ampule;

(B) setting said silica ampule in a horizontal zone melt apparatus composed of a high-temperature oven and a low-temperature oven so that said silica boat is positioned to one side of the high temperature oven;

(C) raising the temperature of the high temperature oven in the horizontal melt apparatus to evaporate said As and to form a melt of GaAs in the boat except for the seed crystal, said melt containing Si as an impurity;

(D) leaving the high and low-temperature ovens as they are for a period of time sufficient to allow oxygen from said oxide and oxygen still remaining in said silica ampule to dissolve in said melt;

(E) decreasing the temperature of the high-temperature oven so as to gradually solidify the melt from the side opposite the seed crystal toward the seed crystal side to form a polycrystalline material from a portion of said melt and to form a melt zone of unsolidified material, said gradual solidification being at a rate sufficient to cause oxygen dissolved in said melt to segregate in said melt zone;

(F) seeding said melt zone when said melt zone attains a melt zone width on the side of the seed crystal, said melt zone width not exceeding ½ the length of a GaAs single crystal formed from said melt; and (G) moving said horizontal zone melt apparatus in a manner such that said melt zone is moved away from the seed crystal while keeping said melt zone width unchanged to grow a GaAs single crystal from said seed crystal behind said moving melt zone.

33. The method of fabricating a GaAs single crystal as claimed in claim 32, wherein said oxide is selected from the group consisting of $Ga_2O_3$ and $As_2O_3$.

34. The method of fabricating a GaAs single crystal as claimed in claim 32, wherein the temperature of the high-temperature oven at a position corresponding to the boat is adjusted between about 900° and 1270° C., so as to regulate the overall temperature of the high-temperature oven to a temperature between about 900° and 1230° C. and said oven temperature is maintained from about thirty minutes to five hours during said leaving step.

35. The method of fabricating a GaAs single crystal as claimed in claim 32, wherein the temperature of the high-temperature oven at the rear end of the boat is gradually decreased from the rear end of the boat toward the seed crystal to a temperature between about 900° to 1270°60 C. after said leaving step until the melt attains said melt zone width on the side of the seed crystal.

36. The method of fabricating a GaAs single crystal as claimed in claim 35, wherein the temperatures of the melt zone is maintained between about 1240° and 1270° C. during said zone melt apparatus moving step.

* * * * *

UNITED STATES PATENT AND TRADEMARK OFFICE
CERTIFICATE OF CORRECTION

PATENT NO. : 5,007,979

DATED : April 16, 1991

INVENTOR(S) : Seiji Mizuniwa; Akio Hattori; Tooru Kurihara; Seigi Aoyama; and Konichi Nakamura It is certified that error appears in the above-identified patent and that said Letters Patent is hereby corrected as shown below:

Column 10, line 20, insert "to 1270°" after --1240°--.

Column 10, line 48, delete "/".

Column 14, line 47, delete "60".

Column 10, line 19, after "entire" insert --GaAs--.

Signed and Sealed this

Second Day of March, 1993

Attest:

STEPHEN G. KUNIN

*Attesting Officer*       *Acting Commissioner of Patents and Trademarks*